(12) United States Patent
Hatano et al.

(10) Patent No.: US 12,265,041 B2
(45) Date of Patent: Apr. 1, 2025

(54) THIN FILM DAMAGE DETECTION FUNCTION AND CHARGED PARTICLE BEAM DEVICE

(71) Applicants: Hitachi High-Tech Corporation, Tokyo (JP); National Institute of Advanced Industrial Science and Technology, Tokyo (JP)

(72) Inventors: Michio Hatano, Tokyo (JP); Mitsuhiro Nakamura, Tokyo (JP); Toshihiko Ogura, Tsukuba (JP)

(73) Assignees: Hitachi High-Tech Corporation, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 182 days.

(21) Appl. No.: 17/767,813

(22) PCT Filed: Oct. 10, 2019

(86) PCT No.: PCT/JP2019/040080
§ 371 (c)(1),
(2) Date: Apr. 8, 2022

(87) PCT Pub. No.: WO2021/070340
PCT Pub. Date: Apr. 15, 2021

(65) Prior Publication Data
US 2024/0085352 A1  Mar. 14, 2024

(51) Int. Cl.
*G01N 23/2204* (2018.01)
*G01N 23/2251* (2018.01)

(52) U.S. Cl.
CPC ..... *G01N 23/2204* (2013.01); *G01N 23/2251* (2013.01); *G01N 2223/20* (2013.01); *G01N 2223/30* (2013.01)

(58) Field of Classification Search
CPC ............ H01J 37/00; H01J 37/02; H01J 37/26; H01J 37/28; H01J 37/18; H01J 37/20;
(Continued)

(56) References Cited

U.S. PATENT DOCUMENTS 6,172,363 B1 * 1/2001 Shinada ............... G01R 31/307
850/10
2007/0125947 A1   6/2007 Sprinzak et al.
(Continued)

FOREIGN PATENT DOCUMENTS

JP      55-98448 A         7/1980
JP      55098448 A     *   7/1980
(Continued)

OTHER PUBLICATIONS

International Search Report (PCT/ISA/210) issued in PCT Application No. PCT/JP2019/040080 dated Dec. 17, 2019 with English translation (two (2) pages).
Japanese-language Written Opinion (PCT/ISA/237) issued in PCT Application No. PCT/JP2019/040080 dated Dec. 17, 2019 (four (4) pages).

*Primary Examiner* — Jason L McCormack
(74) *Attorney, Agent, or Firm* — Crowell & Moring LLP

(57) ABSTRACT

A risk of breakage of a sample holder can be reduced and a biochemical sample or a liquid sample can be observed easily and with a high observation throughput. A sample holder 101 holding a sample includes: a sample chamber including a first insulating thin film 110 and a second insulating thin film 111 that sandwich and hold the sample 200 in a liquid or gel form and face each other, a vacuum partition wall inside which the sample chamber holding the sample is fixed in a state in which the thin film is exposed to a surrounding atmosphere, and whose internal space is kept at a degree of vacuum at least lower than that of the sample room at the time of observation of the sample, a detection electrode 820 disposed to face the second insulat-
(Continued)

ing thin film in a state in which the sample chamber is fixed to the vacuum partition wall, and a signal detection unit 50 connected to the detection electrode. Before the surrounding atmosphere of the sample holder is evacuated from an atmospheric pressure to a vacuum, the charged particle beam device receives a detection signal from the signal detection unit via a connector and detects an abnormality of the sample chamber based on the detection signal.

11 Claims, 9 Drawing Sheets

(58) Field of Classification Search
CPC ........... G01N 23/2204; G01N 23/2251; G01N 2223/20; G01N 2223/30
USPC ............... 250/306, 307, 311, 440.11, 441.11
See application file for complete search history.

(56) References Cited

U.S. PATENT DOCUMENTS

| | | | |
|---|---|---|---|
| 2013/0264476 | A1 | 10/2013 | Damiano, Jr. et al. |
| 2016/0056012 | A1* | 2/2016 | Ogura .................. H01J 37/244 |
| | | | 250/307 |

FOREIGN PATENT DOCUMENTS

| | | |
|---|---|---|
| JP | 2004-95477 A | 3/2004 |
| JP | 2006-518534 A | 8/2006 |
| JP | 2013-535795 A | 9/2013 |
| JP | 2014-203733 A | 10/2014 |
| JP | 2016-72184 A | 5/2016 |
| WO | WO 2012/018827 A2 | 2/2012 |

* cited by examiner

[FIG. 1]
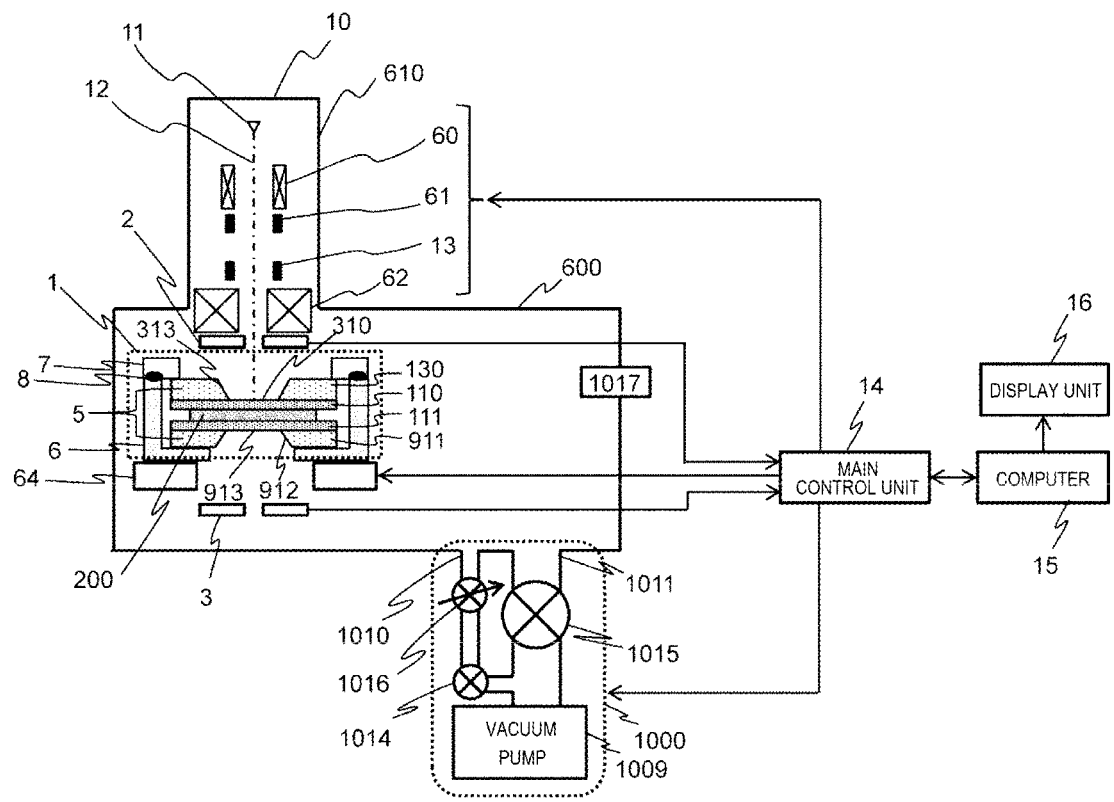
[FIG. 2A]
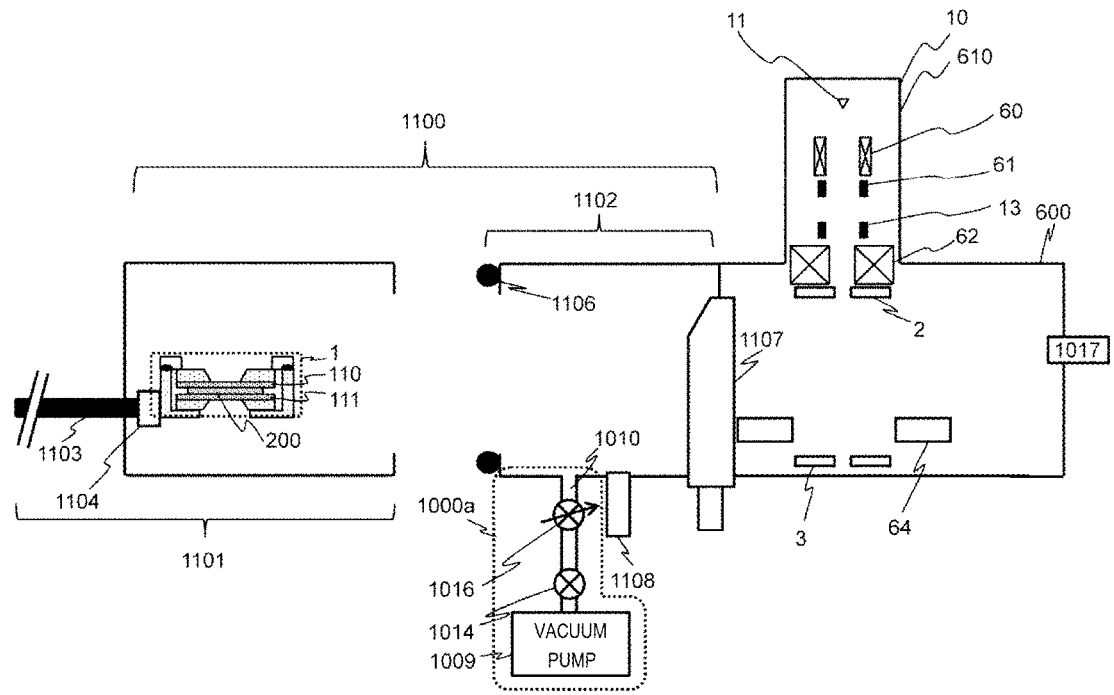

[FIG. 2B]
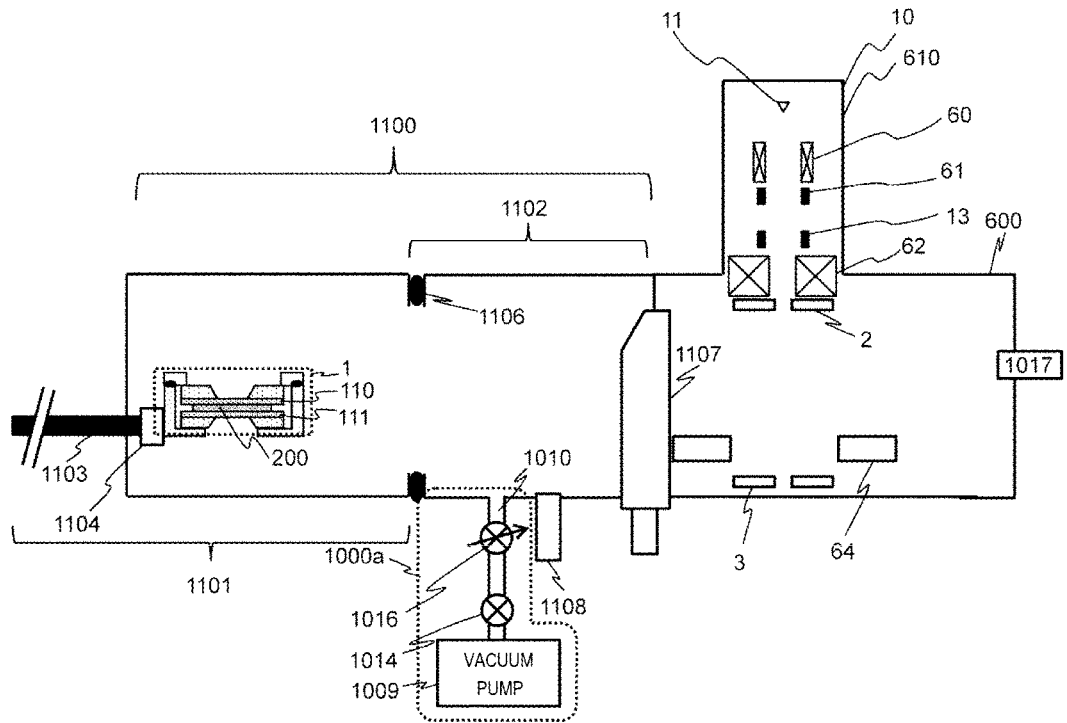
[FIG. 2C]
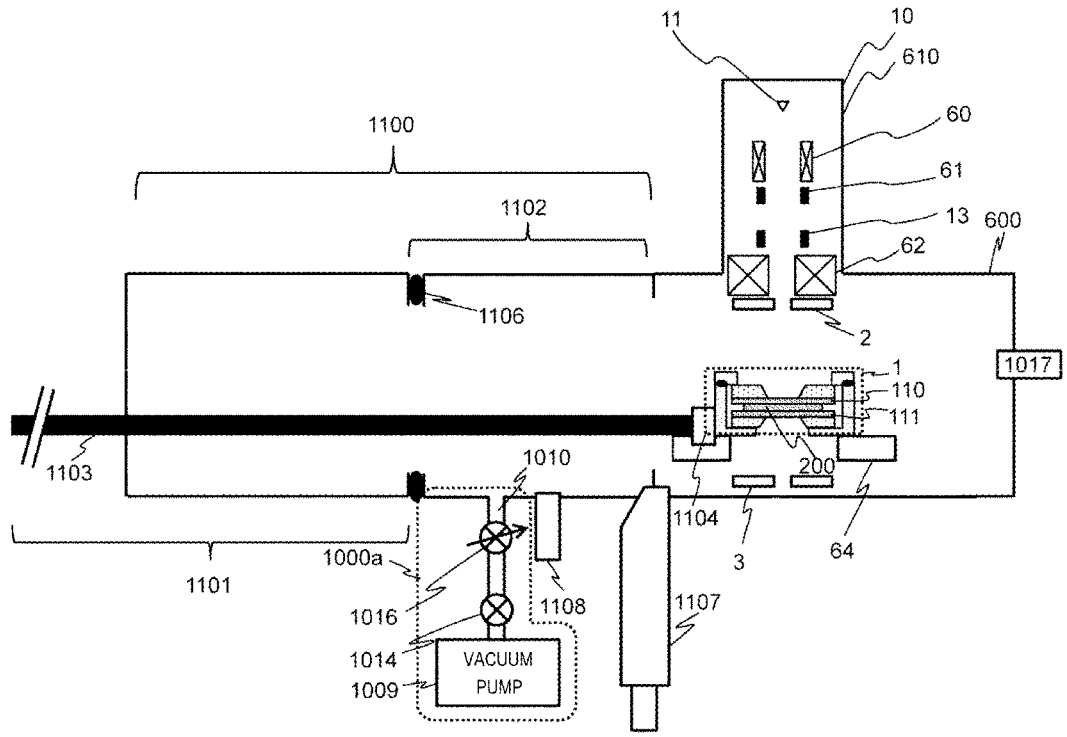

[FIG. 3]
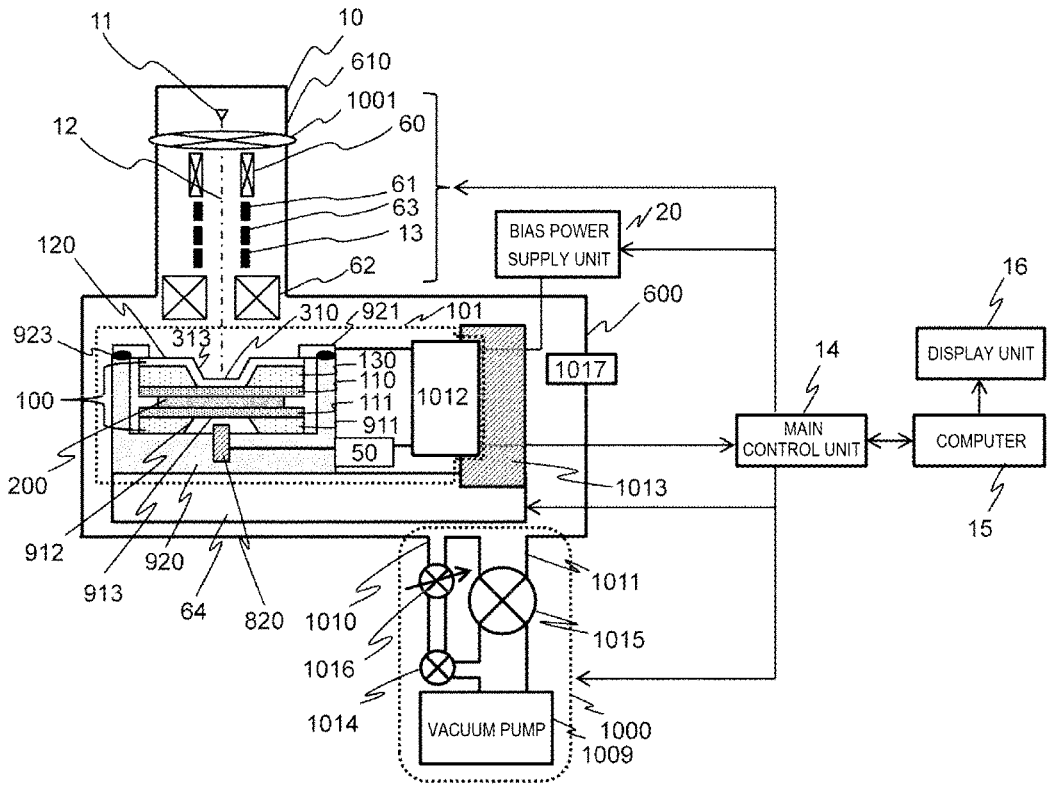
[FIG. 4A]
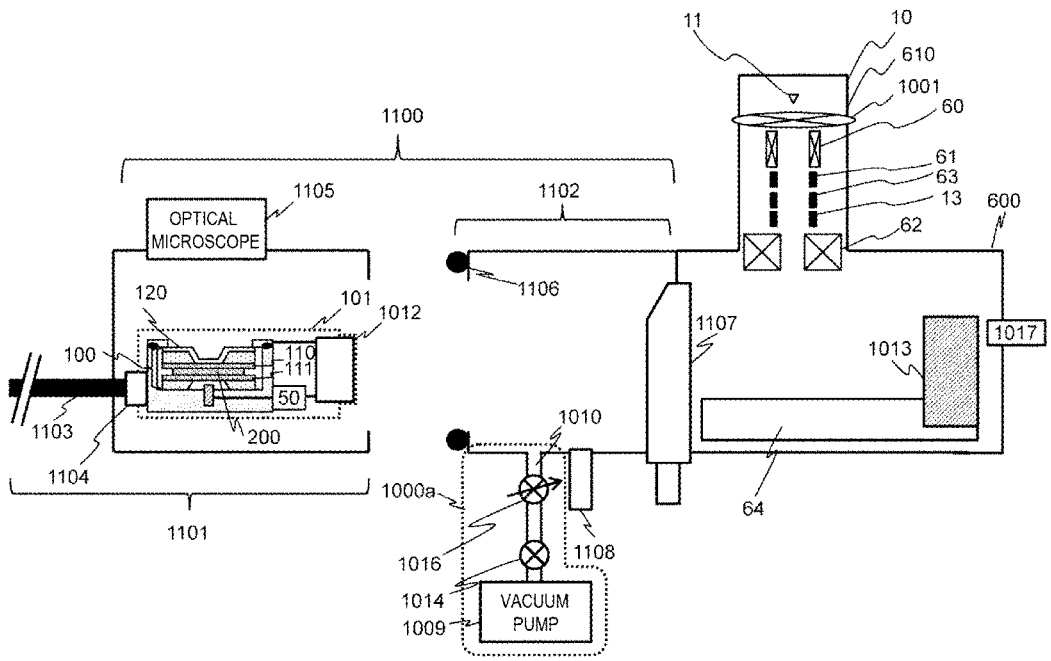

[FIG. 4B]
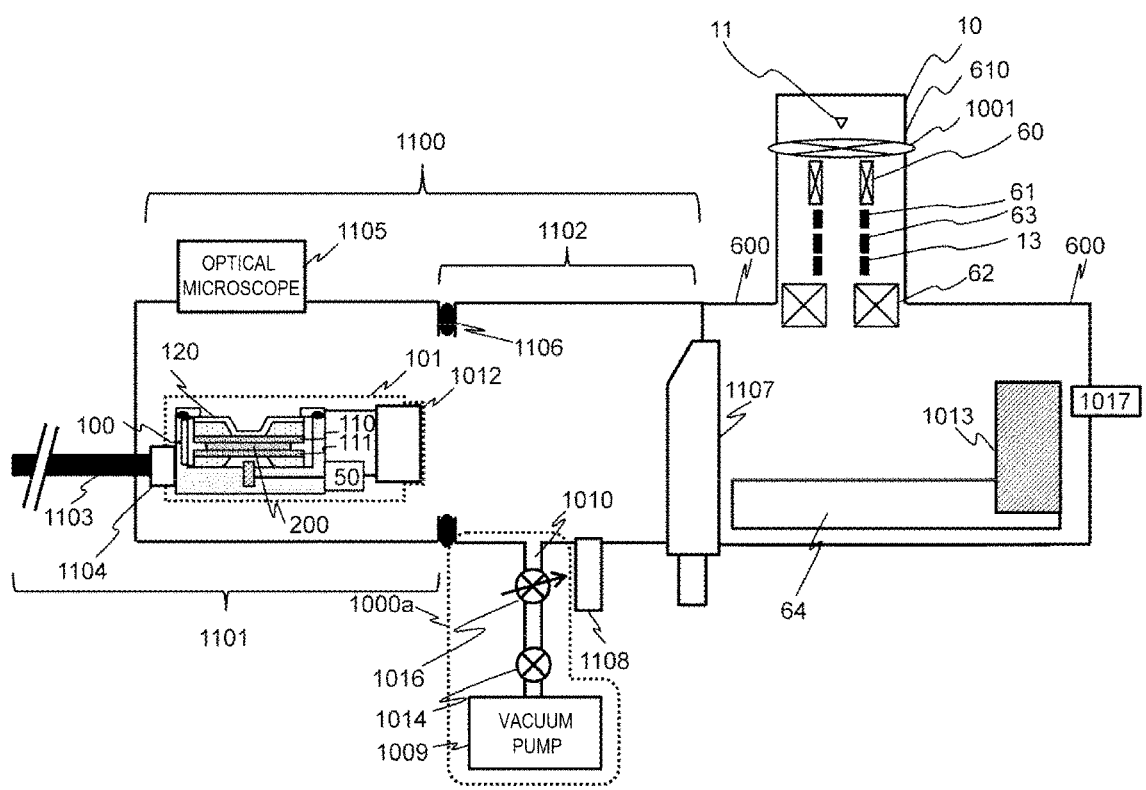

[FIG. 4C]
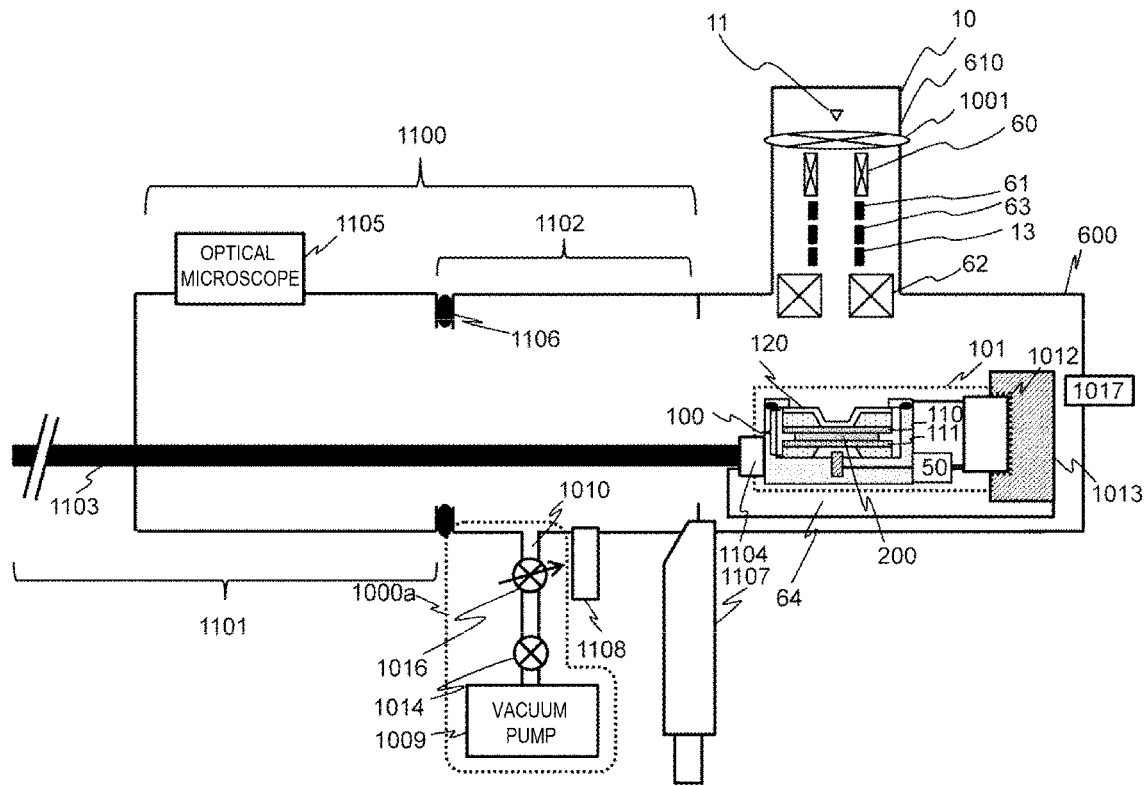
[FIG. 5A]
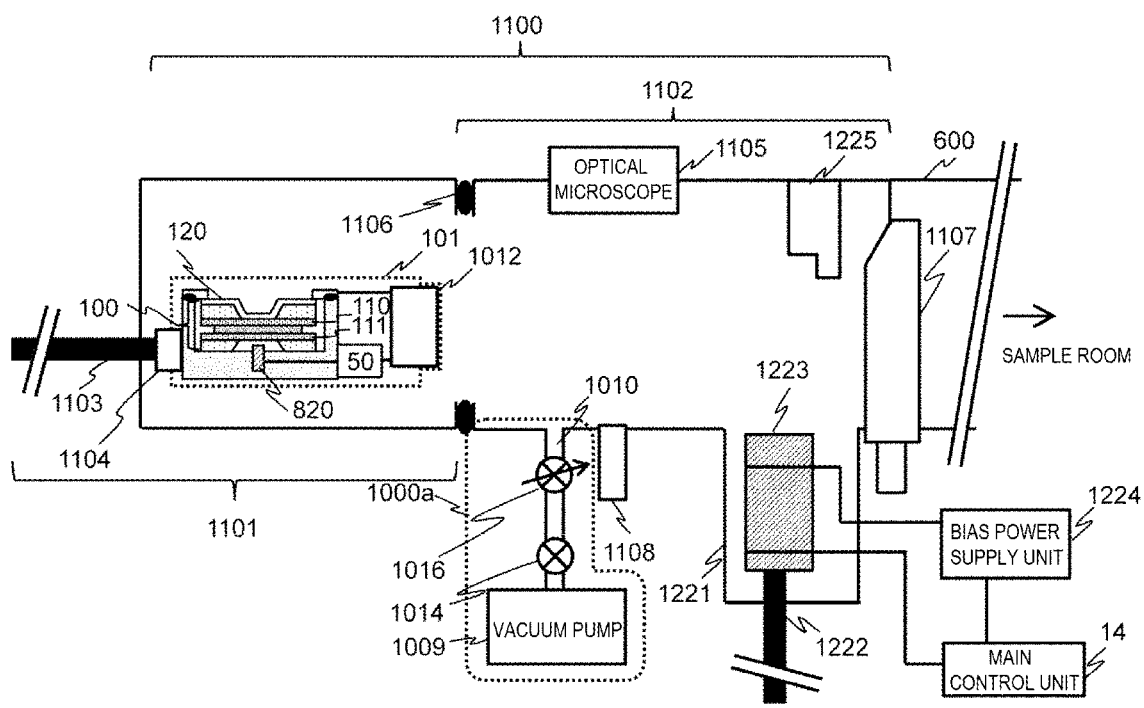

[FIG. 5B]
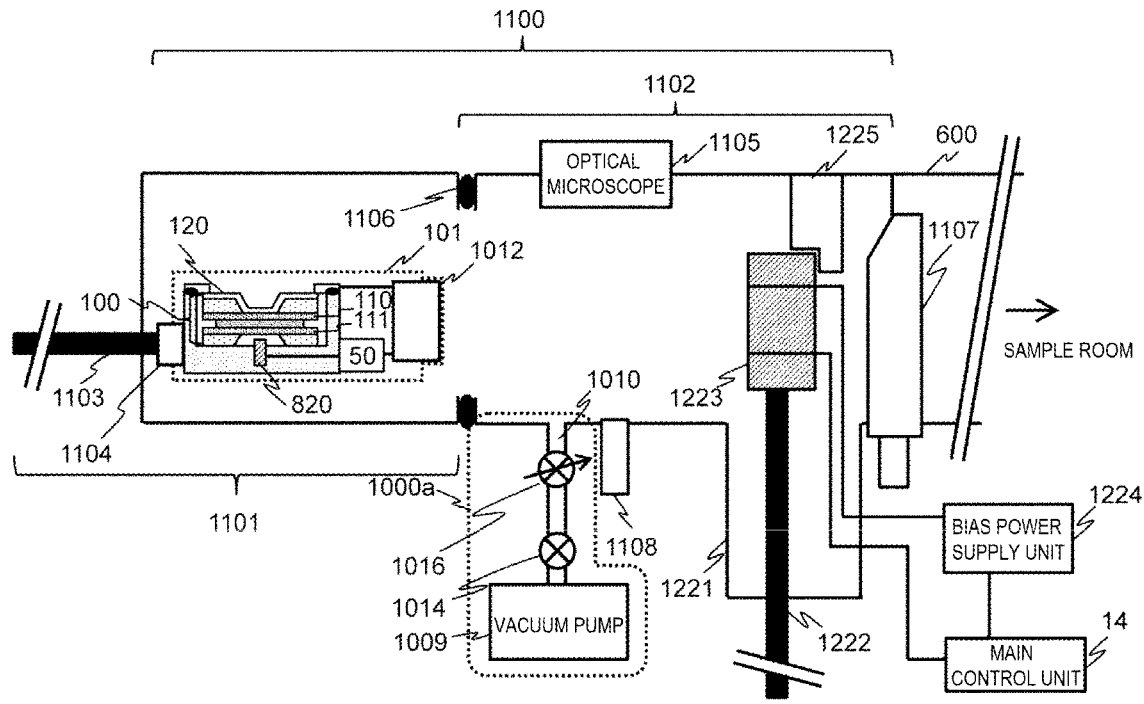
[FIG. 5C]
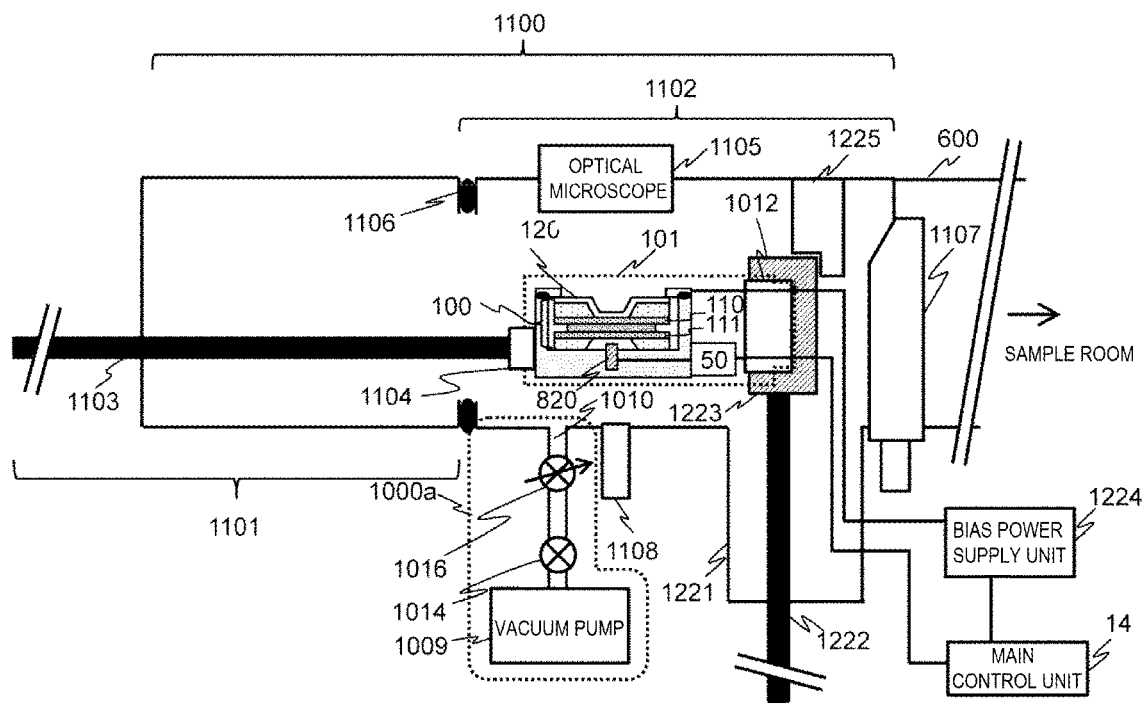

[FIG. 6A]
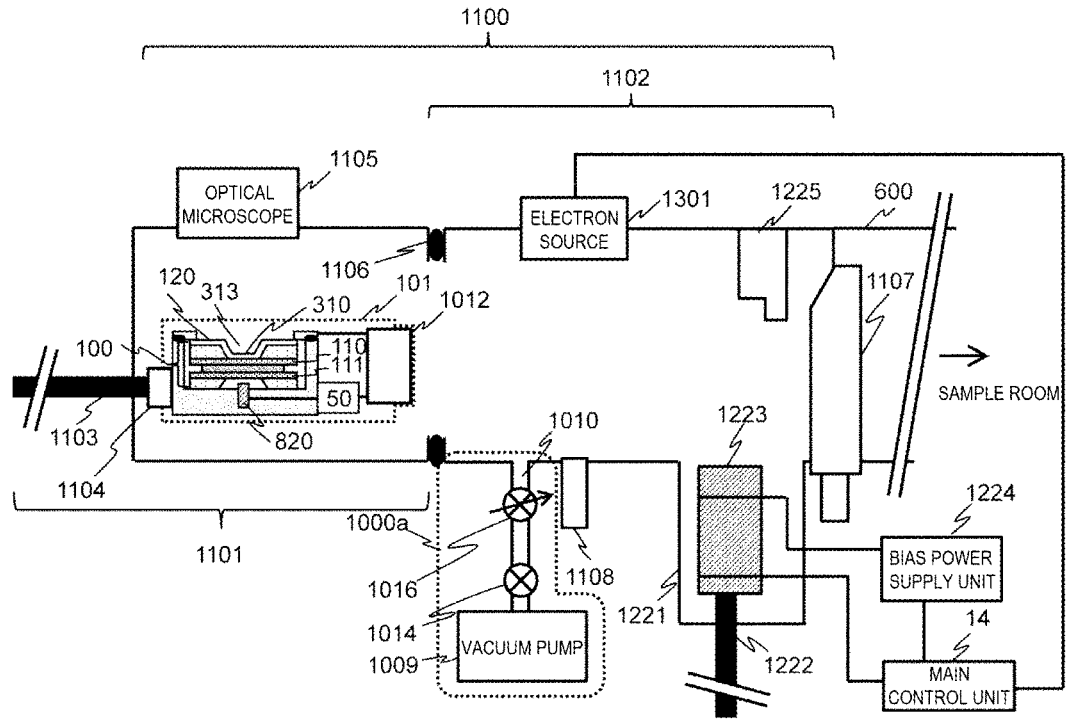
[FIG. 6B]
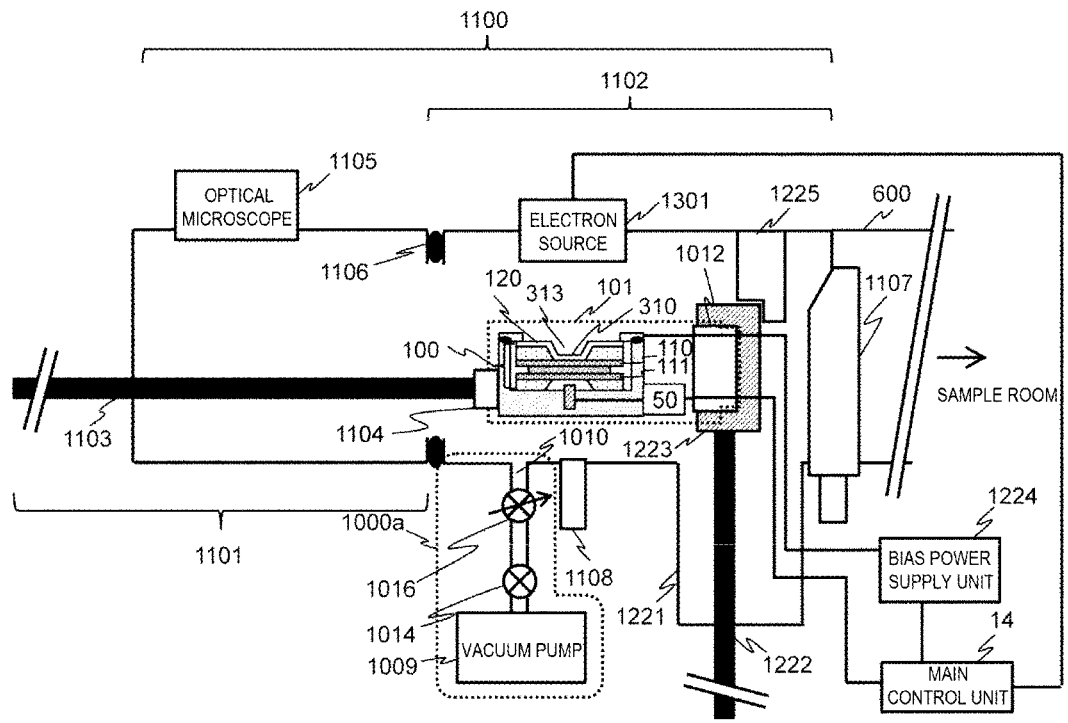

[FIG. 6C]
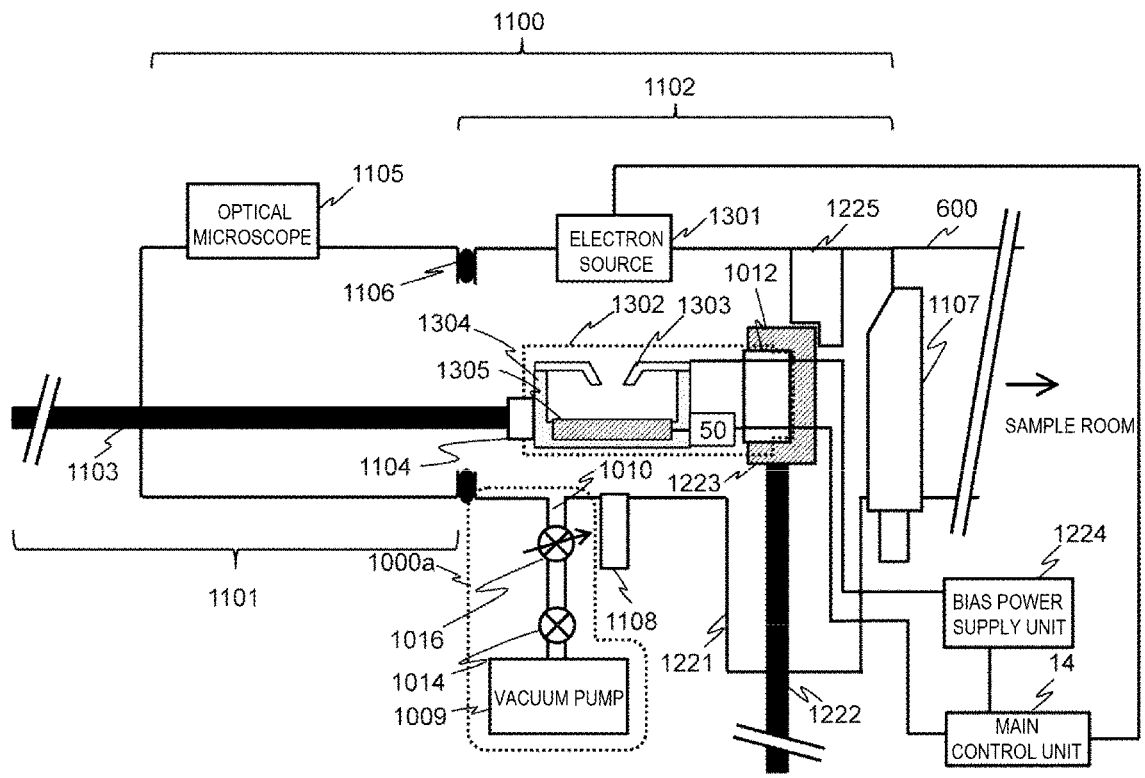
[FIG. 7]
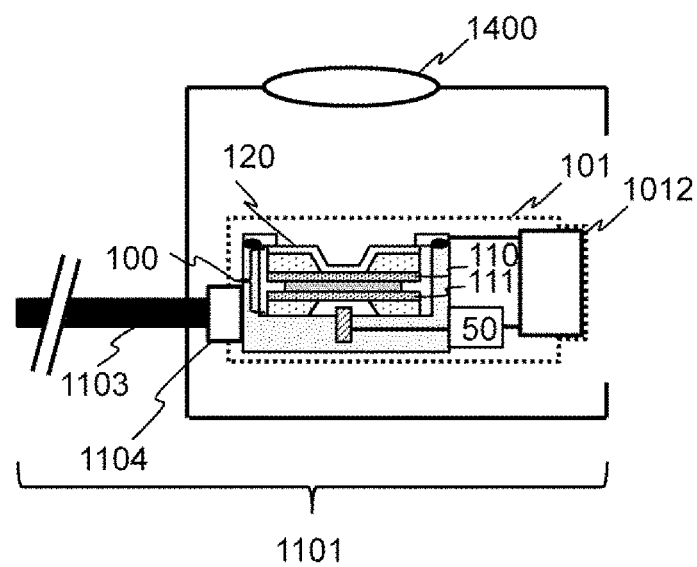

[FIG. 8]
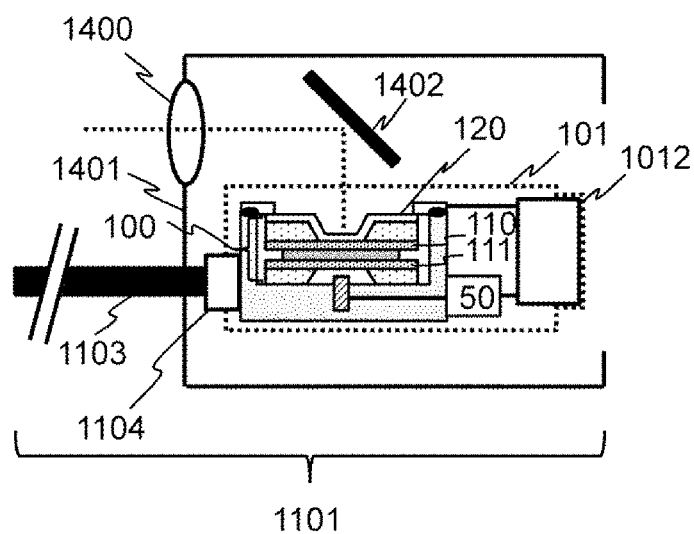

THIN FILM DAMAGE DETECTION FUNCTION AND CHARGED PARTICLE BEAM DEVICE

TECHNICAL FIELD

The present invention relates to a charged particle beam device that is used to observe a shape, a material, or the like of a sample using a detection signal generated by emitting a charged particle beam. Specifically, the invention relates to a charged particle beam device suitable for observation of a biochemical sample or a liquid sample.

BACKGROUND ART

A scanning electron microscope (SEM), which is one of charged particle beam devices, is widely used as a tool for observing not only a material sample such as a metal or a ceramic, but also a biological sample with high resolution.

In general, in these devices, a housing is evacuated to vacuum, and a sample is placed in a vacuum atmosphere and is imaged. Since the electron beam is scattered by gas molecules or liquid molecules such as air, it is preferable to keep a passage path of the electron beam in a vacuum atmosphere. On the other hand, when the sample is placed in the vacuum atmosphere, the biochemical sample or the liquid sample is damaged or changed in state, and therefore it is considered that observation in a non-invasive state is difficult. However, non-invasive observation needs for such a sample are large, and in recent years, an electron microscope enabling observation of a sample to be observed in an atmospheric pressure environment or in a liquid environment is developed.

PTL 1 describes a sample holder for a transmission electron microscope (TEM) or a scanning transmission electron microscope (STEM) that is used to observe a sample by transmitting an electron beam serving as a probe and detecting electrons after the transmission, and for an SEM using a related-art TEM holder and a stage, in which a liquid sample or a gas sample is sandwiched between two microelectronic devices each having a thin-film window through which the electron beam can transmit and is held in a vacuum.

PTL 2 describes a liquid sample container for SEM which is a sample enclosure including an electron beam permeable and fluid impermeable film (referred to as a "fluid impermeable film"). In the sample container of PTL 2, a liquid sample is attached to a surface of the fluid impermeable film facing an electron beam irradiation surface, and the sample container is sealed under a quasi-atmospheric pressure condition and is held in a vacuum. When observation is performed, a primary electron beam passes through the fluid impermeable film and is applied to the sample, and reflected electrons obtained by the primary electron beam interacting with the sample are detected, and thereby the sample in the liquid is observed.

Each of PTLs 3 and 4 describes an observation system and a sample holder used for observation of a biological sample in an aqueous solution in a living state using a scanning electron microscope without performing a dyeing treatment or a fixing treatment. In these observation system, an aqueous solution (liquid sample) containing the sample or a gel (gel sample) containing the sample is attached to either a first insulating thin film fixed to a frame portion provided for the purpose of maintaining strength or the like or a second insulating thin film fixed to the frame portion similarly provided for the purpose of maintaining the strength or the like, both insulating thin films are fixed to face each other and sandwich the sample, and thereby a sample holder is prepared. Alternatively, the first and second insulating thin films are fixed to face each other in advance, and a mechanism for feeding the aqueous solution into a gap between the first and second insulating thin films is provided to introduce the liquid sample into the gap between the insulating thin films. Hereinafter, unless otherwise specified, the gel sample is also referred to as a liquid sample.

In the observation systems described in PTLs 3 and 4, laminated conductive thin films are provided on the other main surface of the first insulating thin film whose main surface is a holding surface of an observation sample, and the observation sample is irradiated with an electron beam from a conductive thin film side in a state in which a ground potential or a predetermined bias voltage is applied to the conductive thin film. Due to the electron beam in the irradiation, a local potential change occurs in the main surface of the first insulating thin film. A signal generated based on the potential change is detected by a detection electrode provided below the second insulating thin film that sandwiches the observation sample together with the first insulating thin film and is disposed on an opposite side of the first insulating thin film.

The signal generated based on the potential change occurring in the first insulating thin film and detected by the detection electrode propagates through the observation sample. A propagation capability of the signal at this time varies depending on the observation sample, and for example, water has a high relative dielectric constant of about 80 and allows the signal to propagate well, and on the other hand, a biological sample has a low relative dielectric constant of about 2 to 3 and the propagation capability of the signal is low. Therefore, based on strength difference of the potential change signal propagated through the observation sample, the biological sample in the aqueous solution can be observed with high contrast without being subjected to the dyeing treatment or the fixing treatment.

CITATION LIST

Patent Literature

PTL 1: JP-A-2013-535795
PTL 2: JP-A-2006-518534
PTL 3: JP-A-2014-203733
PTL 4: JP-A-2016-72184

SUMMARY OF INVENTION

Technical Problem

In the observation systems described in PTLs 1 to 4, in order to perform the electron beam-based observation, a space in which sample is held is isolated from a vacuum by a thin film having a thickness of several tens to several hundreds of nanometers. Therefore, it has been found that when the sample holder in a state in which the sample is sandwiched by thin films is disposed in a sample room or a sample exchange room in an atmospheric pressure state and the sample room or the sample exchange room is evacuated to the vacuum, the thin films may be broken by instantaneously applied a rapid load to the thin films immediately after the start of the evacuation to the vacuum. When the thin films are broken, a loss of the sample or contamination of a housing in the electron microscope occurs.

The invention is made in view of such a problem, and an object of the invention is to provide a charged particle beam device that can reduce a risk of breakage of a sample holder and enable easy observation of a biochemical sample or a liquid sample with a high observation throughput in a non-invasive state having no change in state or damage without being subjected to a dyeing treatment or a fixing treatment.

A charged particle beam device according to an embodiment of the invention receives a detection signal from a detection electrode of a sample holder and detects an abnormality of a sample chamber based on the detection signal, before a surrounding atmosphere of the sample holder is evacuated from an atmospheric pressure to a vacuum in a state in which the sample holder is placed in the sample room or the sample exchange room.

A charged particle beam device according to another embodiment of the invention includes an optical system in a sample exchange room, and a state of a sample chamber can be observed by the optical system while the surrounding atmosphere of the sample holder is being evacuated from an atmospheric pressure to a vacuum in a state in which the sample holder is placed in the sample exchange room.

Advantageous Effects

A risk of breakage of a sample holder can be reduced and a biochemical sample or a liquid sample can be observed easily and with a high observation throughput.

Other problems and novel features will be apparent from description of the present description and accompanying drawings.

BRIEF DESCRIPTION OF DRAWINGS

FIG. 1 is a configuration diagram of a scanning electron microscope according to a first embodiment.

FIG. 2A is another configuration diagram of the scanning electron microscope according to the first embodiment.

FIG. 2B is another configuration diagram of the scanning electron microscope according to the first embodiment.

FIG. 2C is another configuration diagram of the scanning electron microscope according to the first embodiment.

FIG. 3 is a configuration diagram of a scanning electron microscope according to a second embodiment.

FIG. 4A is another configuration diagram of the scanning electron microscope according to the second embodiment.

FIG. 4B is another configuration diagram of the scanning electron microscope according to the second embodiment.

FIG. 4C is another configuration diagram of the scanning electron microscope according to the second embodiment.

FIG. 5A is still another configuration diagram of the scanning electron microscope according to the second embodiment.

FIG. 5B is still another configuration diagram of the scanning electron microscope according to the second embodiment.

FIG. 5C is still another configuration diagram of the scanning electron microscope according to the second embodiment.

FIG. 6A is still another configuration diagram of the scanning electron microscope according to the second embodiment.

FIG. 6B is still another configuration diagram of the scanning electron microscope according to the second embodiment.

FIG. 6C is still another configuration diagram of the scanning electron microscope according to the second embodiment.

FIG. 7 shows an example in which an optical lens is provided in a sample exchange room front portion.

FIG. 8 shows an example in which the optical lens is provided in a sample exchange room front portion.

DESCRIPTION OF EMBODIMENTS

Hereafter, embodiments of the invention will be described with reference to the drawings.

First Embodiment

FIG. 1 shows a configuration diagram of a scanning electron microscope according to a first embodiment. A housing 10 includes a column 610 in which an electron optical system for irradiating a sample to be observed with an electron beam is built, and a sample room 600 in which the sample is placed. Since the housing 10 is required to be in a high vacuum environment when the sample is irradiated with an electron beam 12, the sample room 600 is provided with a pressure sensor 1017 for measuring an air pressure in the room. The electron optical system includes an electron gun 11, a condenser lens 60 and an objective lens 62 by which the electron beam 12 emitted from the electron gun 11 is focused and emitted to a sample chamber 5 as a minute spot, an astigmatism corrector 61 that corrects astigmatism of the electron beam 12, and a deflector 13 that deflects the electron beam 12 to two-dimensionally scan a sample 200. The sample room 600 is provided with a three-dimensionally movable stage 64. A sample holder 1 to which the sample chamber 5 holding the sample 200 to be observed is fixed is mounted on the stage 64 when the sample is observed.

A detector 2 is provided directly below the objective lens 62. The detector 2 detects reflected electrons emitted due to interaction between the electron beam 12 and the sample 200 in the irradiation of the electron beam 12, and examples of the detector 2 include a semiconductor detector and a detector including a scintillator, a light guide, and a photomultiplier tube. In addition, a detector 3 is provided below the sample stage 64. The detector 3 detects electrons passing though the sample 200, and similarly, a semiconductor detector and a detector including a scintillator, a light guide, and a photomultiplier tube are used as the detector 3. In the present embodiment, the scanning electron microscope may include only one of the detector 2 and the detector 3, or may include both the detector 2 and the detector 3.

The sample holder 1 includes the sample chamber 5 that holds the sample 200, and a vacuum partition wall that maintains a space around the sample 200 in the atmospheric pressure state or a quasi-atmospheric pressure state having a degree of vacuum lower than that of the sample room 600.

The sample chamber 5 (a cross-sectional view thereof is shown in the drawing) holds the sample 200 by sandwiching the sample 200 from above and below by two laminates of several millimeters to ten and several millimeters square. A first laminate of the sample chamber 5 includes, on an irradiation surface side of the electron beam 12, an insulating thin film 110 that isolates the sample 200 from the vacuum in the sample room, and the insulating thin film 110 is supported by an outer frame portion 130 provided for the purpose of maintaining strength. The outer frame portion 130 includes a window frame portion 313 recessed in an inverted pyramid shape, a window region 310 corresponding to a bottom surface of the window frame portion 313 has a rectangular shape, and the insulating thin film 110 is exposed to the irradiation surface side of the electron beam 12. A silicon nitride (SiN) film or a silicon oxide (SiO) film can be used as a material of the first insulating thin film 110, and a silicon (Si) substrate can be used as a material of the first outer frame portion 130.

The sample 200 is held between the insulating thin film 110 and a sample holding layer facing the insulating thin film 110. The sample 200 is in a gas form, a liquid form, or a gel form containing a sample to be observed. The sample holding layer is configured as a second laminate and includes a second insulating thin film 111 and a second outer frame portion 911 that supports the second insulating thin film 111. The outer frame portion 911 includes a window frame portion 912 recessed in an inverted pyramid shape, a window region 913 corresponding to a bottom surface of the window frame portion 912 has a rectangular shape, and the insulating thin film 111 is exposed to a stage 64 side. The second window region 913 is preferably formed in the same region as the first window region 310 or in a region covering the first window region 310 when viewed from an upper surface of the sample chamber 5. Similar to the first laminate, a silicon nitride (SiN) film or a silicon oxide (SiO) film can be used as a material of the second insulating thin film 111, and a silicon (Si) substrate can be used as a material of the second outer frame portion 911. The first and second laminates constituting the sample chamber 5 can be formed using a semiconductor process (a MEMS process).

The sample chamber 5 is fixed in a vacuum partition wall having a hollow inside. The vacuum partition wall includes a vacuum partition wall lower part 6 and a vacuum partition wall upper part 7. The vacuum partition wall lower part 6 and the vacuum partition wall upper part 7 are, for example, conductors such as aluminum. The vacuum partition wall lower part 6 and the vacuum partition wall upper part 7 are connected to each other via a sealing material 8 for airtightness, and hold a space around the sample 200 in an atmospheric pressure state or a quasi-atmospheric pressure state having a degree of vacuum lower than that of the sample room. The sample holder 1 is placed on the stage 64 by the vacuum partition wall lower part 6, so that the sample 200 is placed on the stage 64 in a state in which the sample 200 is electrically insulated from the stage 64.

The electron optical system, the stage 64, and a vacuum evacuation system for evacuating a space in the housing 10 to be described later to a vacuum are controlled by a main control unit 14. The main control unit 14 is connected to a computer 15 to which a display unit 16 is connected. A user operates the scanning electron microscope using the computer 15 and a user interface (GUI) on the display unit 16. The computer 15 transmits, to the main control unit 14, a command input by the user using the GUI, and the main control unit 14 controls each component of the scanning electron microscope in accordance with the command. Further, the computer 15 performs image processing on image data from the main control unit 14 and displays the image data on the display unit 16.

Before the sample is observed by using the scanning electron microscope in FIG. 1, the user places, on the stage 64, the sample holder 1 that holds the sample 200 by the sample chamber 5 in a state in which the sample room 600 is in the atmospheric environment. At this time, it is preferable to confirm by visual observation or other means that the insulating thin films of the sample chamber 5 are not broken. After the sample holder 1 is placed on the stage 64 and the sample room 600 is sealed and can be evacuated to a vacuum, the user uses the GUI to instruct the main control unit 14 to start vacuum evacuation of the sample room 600.

When the vacuum evacuation of the sample room 600 is started, the main control unit 14 determines the degree of vacuum of the sample room 600 based on a read value of the pressure sensor 1017 provided in the sample room 600 or an elapsed time from the start of the vacuum evacuation, and when the main control unit 14 determines that electron beam irradiation-based image observation can be performed, the main control unit 14 displays the determination on the display unit 16 via the computer 15. The details of a method for evacuating the sample room 600 to a vacuum will be described below.

Thereafter, the user uses the GUI to input an observation start command. The main control unit 14 receives an output of the detector 2 or the detector 3 for each irradiation position of the electron beam 12 onto the sample chamber 5, converts the output into pixel gradation data corresponding to the strength of the output, and outputs the pixel gradation data to the computer 15 as image data every time one frame scanning is completed, every time one line scanning is completed, or every time one pixel scanning is completed, depending on a deflection speed. The image data is subjected to image processing by the computer 15 as necessary, and is displayed on the display unit 16.

In the observation performed using the sample holder 1, an acceleration voltage of the electron beam 12 is preferably set to a high acceleration voltage at which the electron beam 12 passes through the first insulating thin film 110. This is to enable detection of electrons generated by the interaction between the primary electron beam 12 and the sample 200 in the detector 2 or the detector 3.

When the sample room 600 is evacuated to vacuum, as shown in FIG. 1, the first insulating thin film 110 and the second insulating thin film 111 of the sample chamber 5 are exposed to the sample room 600 in a state of sandwiching the sample 200 in the window regions of the first insulating thin film 110 and the second insulating thin film 111. A thickness of each insulating thin film is merely about 10 nm to 20 nm. In order to improve the observation throughput of the scanning electron microscope, the time required for vacuuming the sample room 600 to a vacuum is preferably short, and in general, an air pressure in the sample room 600 is exponentially reduced by the vacuum evacuation system. On the other hand, the space around the sample 200 is kept airtight to be maintained at the atmospheric pressure or the quasi-atmospheric pressure by the vacuum partition wall. Therefore, particularly immediately after the start of the vacuum evacuation, the air pressure in the sample room 600 rapidly decreases, and due to a pressure difference between the inside and the outside of the first insulating thin film 110 or the second insulating thin film 111, a load is applied to each insulating thin film so as to be set to a vacuum side (sample room 600 side). Accordingly, a volume between the first insulating thin film 110 and the second insulating thin film 111 greatly fluctuates instantaneously, and accordingly, the sandwiched sample 200 may violently collide with the insulating thin films and the insulating thin films may be damaged. When the sample contains a spike-shaped structure, the insulating thin films are likely to be damaged particularly due to instantaneous pressure fluctuation.

Therefore, the scanning electron microscope in FIG. 1 includes a first-stage vacuum evacuation system 1000 capable of reducing a risk of breakage of the insulating thin films of the sample chamber 5. The first-stage vacuum evacuation system 1000 includes a vacuum pump 1009, a slow evacuation path 1010, a high-speed evacuation path 1011, and a valve for each evacuation path. For example, a pipe diameter of the slow evacuation path 1010 is set to be smaller than a pipe diameter of the high-speed evacuation path 1011, and thereby an evacuation capacity is limited. A conductance of the high-speed evacuation path 1011 may be set to be larger than a conductance of the slow evacuation path 1010, and a difference in the pipe diameters is an example. In addition, the slow evacuation path 1010 includes a slow evacuation path valve 1014, and the high-speed evacuation path 1011 includes a high-speed evacuation path valve 1015. Both the slow evacuation path valve 1014 and the high-speed evacuation path valve 1015 are opening and closing valves.

The vacuum pump 1009 is preferably a vacuum pump that can be used from the atmospheric pressure, and examples of the vacuum pump include a rotary pump, a diaphragm pump, and a dry pump. In order to create a high vacuum condition, a next-stage high-speed vacuum evacuation system (not shown) is preferably provided for the sample room 600. A turbo-molecular pump, an oil diffusion pump, an ion pump, a cry pump, or the like having a high ultimate degree of vacuum is preferably used for the next-stage high-speed vacuum evacuation system.

Hereafter, a first-stage vacuum evacuation according to the present embodiment will be described. When the first-stage vacuum evacuation system 1000 starts the vacuum evacuation of the sample room 600, the main control unit 14 sets the high-speed evacuation path valve 1015 to a CLOSE (close) state and the slow evacuation path valve 1014 to an OPEN (open) state, and starts the vacuum evacuation by the vacuum pump 1009. The main control unit 14 sets the slow evacuation path valve 1014 to a CLOSE state and the high-speed evacuation path valve 1015 to an OPEN state based on the read value of the pressure sensor 1017 or the elapsed time from the start of the vacuum evacuation. When the vacuum evacuation of the sample room 600 is started in this way, by setting a slow evacuation period, a rapid load can be prevented from being applied to the insulating thin films of the sample chamber 5, and a risk of breakage of the insulating thin films can be reduced.

In order to further reduce the rapid load generated in the insulating thin films at the start of the vacuum evacuation, an evacuation flow rate adjustment valve 1016 may be provided on the sample room 600 side of the slow evacuation path valve 1014 in the slow evacuation path 1010 (FIG. 1 shows a form in which the evacuation flow rate adjustment valve is provided). The evacuation flow rate adjustment valve 1016 may be controlled by the main control unit 14 or may be manually controlled by the user. When the evacuation flow rate adjustment valve 1016 is used and the first-stage vacuum evacuation system 1000 starts the vacuum evacuation of the sample room 600, the main control unit 14 sets the high-speed evacuation path valve 1015 to the CLOSE state, the evacuation flow rate adjustment valve 1016 to the CLOSE state, and the slow evacuation path valve 1014 to the OPEN (open) state, and starts the vacuum evacuation by the vacuum pump 1009. The main control unit 14 operates the evacuation flow rate adjustment valve 1016 to gradually increase an evacuation flow rate based on the read value of the pressure sensor 1017 or the elapsed time from the start of the vacuum evacuation. Thereafter, the main control unit 14 sets the slow evacuation path valve 1014 to a CLOSE state and the high-speed evacuation path valve 1015 to an OPEN state based on the read value of the pressure sensor 1017 or the elapsed time from the start of the vacuum evacuation.

When the evacuation flow rate adjustment valve 1016 is used, as described below, a single-system evacuation path can be provided instead of providing a two-system evacuation path including the slow evacuation path 1010 and the high-speed evacuation path 1011. In this case, the main control unit 14 determines that the sample room 600 has reached a predetermined degree of vacuum based on the read value of the pressure sensor 1017 or the elapsed time from the start of the vacuum evacuation, and starts the vacuum evacuation of the sample room 600 by the next-stage high-speed vacuum evacuation system. When the user manually operates the evacuation flow rate adjustment valve 1016, the main control unit 14 determines, based on the read value of the pressure sensor 1017, the start of the vacuum evacuation of the sample room 600 performed by the next-stage high-speed vacuum evacuation system.

In this way, in the first embodiment, the risk of breakage of the insulating thin films of the sample chamber is reduced by setting a slow evacuation period and relaxing a rapid pressure change at the time of the start of the vacuum evacuation.

FIG. 2A shows another configuration diagram of the scanning electron microscope according to the first embodiment. The main control unit 14, the computer 15, and the display unit 16 are the same as those of the scanning electron microscope in FIG. 1, and thus description thereof is omitted. The scanning electron microscope shown in FIG. 2A includes a sample exchange room 1100 separated from the sample room 600 by a gate valve 1107, and the sample exchange room 1100 is provided with a first-stage vacuum evacuation system 1000a capable of reducing the risk of breakage of the insulating thin films of the sample chamber 5.

The sample exchange room 1100 includes a sample exchange room front portion 1101 and a sample exchange room rear portion 1102. The sample exchange room front portion 1101 is provided with a sample exchange rod 1103 and a sample holder attachment 1104 that connects the sample holder 1 to the sample exchange rod 1103. The sample exchange room rear portion 1102 is provided with a first-stage vacuum evacuation system 1000a, a sample exchange room sealing member 1106, and the gate valve 1107. In addition, the sample exchange room rear portion 1102 may be provided with a sample exchange room pressure sensor 1108 for measuring an air pressure in the sample exchange room 1100. The first-stage vacuum evacuation system 1000a shown in FIG. 2 includes a single-system evacuation path, and includes the vacuum pump 1009, the slow evacuation path 1010, the slow evacuation path valve 1014, and the evacuation flow rate adjustment valve 1016.

An operation before the observation is performed will be described with reference to FIGS. 2A to 2C. First, as shown in FIG. 2A, in a state in which an inside of the sample exchange room 1100 is in an atmospheric pressure state, the sample holder 1 prepared in advance is connected to the sample exchange rod 1103 by the sample holder attachment 1104 and is stored in the sample exchange room front portion 1101. At this time, the sample room 600 has already been evacuated, by a vacuum evacuation system (not shown), to a high vacuum state in which electron beam irradiation can be performed.

Subsequently, as shown in FIG. 2B, the sample exchange room front portion 1101 is fixed to the sample exchange room rear portion 1102. At the time of vacuum evacuation described below, the inside of the sample exchange room 1100 is sealed from an external atmospheric pressure atmosphere by the sample exchange room sealing member 1106.

In this state, when the main control unit 14 receives the evacuation start command from the user, the main control unit 14 sets the evacuation flow rate adjustment valve 1016 to the CLOSE state and the slow evacuation path valve 1014 to the OPEN state, and starts the vacuum evacuation of the sample exchange room 1100 by the vacuum pump 1009.

The main control unit 14 operates the evacuation flow rate adjustment valve 1016 to gradually increase the evacuation flow rate based on a read value of the pressure sensor 1108 or the elapsed time from the start of the vacuum evacuation. When the main control unit 14 determines that the sample exchange room 1100 has reached a predetermined degree of vacuum based on the read value of the pressure sensor 1108 or the elapsed time from the start of the vacuum evacuation, the main control unit 14 releases a lock of the gate valve 1107 and notifies the user of the lock release by using the GUI. When the user manually operates the evacuation flow rate adjustment valve 1016, the main control unit 14 determines a degree of vacuum of the sample exchange room 1100 based on the read value of the pressure sensor 1108.

The user issues, using the GUI, an instruction for setting the gate valve 1107 to an OPEN (open) state, and as shown in FIG. 2C, the user pushes the sample exchange rod 1103 to insert the sample holder 1 into the sample room 600 and to place the sample holder 1 on the stage 64. Then, the user releases the connection between the sample holder attachment 1104 and the sample holder 1, pulls out the sample exchange rod 1103 to the sample exchange room front portion 1101, and set the gate valve 1107 again to a CLOSE (close) state using the GUI. The main control unit 14 confirms that the gate valve 1107 has been closed, and when the electron beam irradiation-based image observation can be performed, the main control unit 14 displays the confirmation on the display unit 16 via the computer 15. In this state, the user uses the GUI to input an observation start command.

In this way, by performing the vacuum evacuation for relaxing the rapid pressure change in the sample exchange room having a smaller volume, the risk of breakage of the thin films of the sample chamber can be reduced, rapid sample holder exchange can be realized, and the observation throughput can be improved.

In the present embodiment, the sample exchange room may be provided with an optical system as shown in FIGS. 4A to 4C and FIGS. 7 and 8 described below, and the state of the sample chamber may be observed.

Second Embodiment

FIG. 3 shows a configuration diagram of a scanning electron microscope according to a second embodiment. The housing 10 includes the column 610 in which an electron optical system for irradiating a sample to be observed with an electron beam is built, and the sample room 600 in which the sample is placed. Since the housing 10 is required to be in a high vacuum environment when the sample is irradiated with the electron beam 12, the sample room 600 is provided with the pressure sensor 1017 for measuring an air pressure in the room. The electron optical system includes the electron gun 11, the condenser lens 60 and the objective lens 62 by which the electron beam 12 emitted from the electron gun 11 is focused and emitted to a sample chamber 100 as a minute spot, the astigmatism corrector 61 that corrects astigmatism of the electron beam 12, and the deflector 13 that deflects the electron beam 12 to two-dimensionally scan the sample chamber 100. In addition, in the example, an electrostatic blanker 63 is provided. The electrostatic blanker 63 generates an electrostatic field perpendicular to a traveling direction (an optical axis direction) of the electron beam 12 as described below. In addition, the column 610 is provided with a gun valve 1001. In the column 610, a periphery of the electron gun 11 is also required to be in a particularly high vacuum state. Therefore, in a state in which the electron beam 12 is not emitted to the sample, the gun valve 1001 is always in a CLOSE (closed) state, and is set to an OPEN (open) state when the electron beam irradiation is performed. An inside of the column 610 on an electron gun 11 side of the gun valve 1001 is evacuated to a vacuum by a vacuum system (not shown). The sample room 600 is provided with the three-dimensionally movable stage 64, and a sample holder 101 to which the sample chamber 100 holding the sample 200 to be observed is fixed is placed on the stage 64.

The sample holder 101 includes the sample chamber 100 that holds the sample 200, a vacuum partition wall that maintains a space around the sample 200 in the atmospheric pressure state or a quasi-atmospheric pressure state having a degree of vacuum lower than that of the sample room 600, a detection electrode 820 provided in the vacuum partition wall, a signal detection unit 50 connected to the detection electrode 820, and a terminal 1012 for electric signal communication with outside.

The sample chamber 100 (a cross-sectional view thereof is shown in the drawing) holds the sample 200 by sandwiching the sample 200 from above and below by two laminates of several millimeters to ten and several millimeters square. A first laminate of the sample chamber 100 includes, on an irradiation surface side of the electron beam 12, a separation film that isolates the sample 200 from the vacuum in the sample room. The separation film includes at least two layers including the first insulating thin film 110 on a sample 200 side and a conductive thin film 120 on an electron beam 12 incident side. The first insulating thin film 110 is supported by the outer frame portion 130 provided for the purpose of maintaining strength, and the conductive thin film 120 is uniformly formed on the outer frame portion 130 and the first insulating thin film 110. The outer frame portion 130 includes a window frame portion 313 recessed in an inverted pyramid shape, a window region 310 corresponding to a bottom surface of the window frame portion 313 has a rectangular shape. In the window region 310, the first insulating thin film 110 and the conductive thin film 120 are in contact with each other. A silicon nitride (SiN) film or a silicon oxide (SiO) film can be used as a material of the first insulating thin film 110, and a silicon (Si) substrate can be used as a material of the first outer frame portion 130. In addition, a metal thin film such as tungsten or tantalum film can be used as the conductive thin film 120.

The sample 200 is held between the separation film and a sample holding layer facing the separation film. The sample 200 is in a liquid form or a gel form containing a sample to be observed. The sample holding layer is configured as a second laminate and includes the second insulating thin film 111 and the second outer frame portion 911 that supports the second insulating thin film 111. The outer frame portion 911 includes the window frame portion 912 recessed in an inverted pyramid shape, the window region 913 corresponding to a bottom surface of the window frame portion 912 has a rectangular shape, and the insulating thin film 111 is exposed to a stage 64 side. When the sample chamber 100 is fixed to the vacuum partition wall, the insulating thin film 111 and the detection electrode 820 disposed in a vacuum separation film face each other. The second window region 913 is preferably formed in the same region as the first window region 310 or in a region covering the first window region 310 when viewed from an upper surface of the sample chamber 100. Similar to the first laminate, a silicon nitride (SiN) film or a silicon oxide (SiO) film can be used as a material of the second insulating thin film 111, and a silicon (Si) substrate can be used as a material of the second outer frame portion 911. The first laminate and the second laminate constituting the sample chamber 100 can be formed using a semiconductor process (a MEMS process).

The sample chamber 100 is fixed in a vacuum partition wall having a hollow inside. The vacuum partition wall includes a vacuum partition wall lower part 920 and a vacuum partition wall upper part 921. The vacuum partition wall lower part 920 is, for example, an insulator such as acrylic, and the vacuum partition wall upper part 921 is, for example, a conductor such as aluminum. The vacuum partition wall upper part 921 is electrically connected to the conductive thin film 120 of the sample chamber 100 by contacting with the conductive thin film 120 of the sample chamber 100. The vacuum partition wall lower part 920 is provided with the detection electrode 820 electrically insulated from each of the vacuum partition wall upper part 921, the stage 64, and the sample chamber 100. Specifically, the detection electrode 820 is held in a space formed by the window frame portion 912 of the second laminate and the vacuum partition wall lower part 920 in a state in which the detection electrode 820 is not in contact with both the insulating thin film 111 and the outer frame portion 911 of the second laminate. The vacuum partition wall lower part 920 and the vacuum partition wall upper part 921 are connected to each other via a sealing member 923 for airtightness, and hold a space around the window frame portion 912 and the sample 200 in an atmospheric pressure state or a quasi-atmospheric pressure state having a degree of vacuum lower than that of the sample room. The sample holder 101 is placed on the stage 64 by the vacuum partition wall lower part 920, so that the sample chamber 100 is placed on the stage 64 in a state in which the sample chamber 100 is electrically insulated from the stage 64.

The electron optical system, the stage 64, the vacuum evacuation system for making the space in the housing 10 into a vacuum environment, and a to-be-described-later bias power supply unit 20 that applies a bias potential necessary for detecting a signal from the detection electrode 820 to the sample chamber 100 are controlled by the main control unit 14. The main control unit 14 is connected to the computer 15 to which the display unit 16 is connected. A user operates the scanning electron microscope using the computer 15 and a user interface (GUI) on the display unit 16. The computer 15 transmits, to the main control unit 14, a command input by the user using the GUI, and the main control unit 14 controls each component of the scanning electron microscope in accordance with the command. Further, the computer 15 performs image processing on image data from the main control unit 14 and displays the image data on the display unit 16.

The terminal 1012 provided in the sample holder 101 is connected to a connector 1013 provided on the stage 64. The connector 1013 is connected to the bias power supply unit 20 and the main control unit 14 that are disposed outside the sample room 600. A bias potential output from the bias power supply unit 20 can be supplied to the conductive thin film 120 of the sample chamber 100 by connecting the terminal 1012 and the connector 1013. The bias power supply unit 20 supplies a bias potential the same as or different from a potential of the detection electrode 820 to the conductive thin film 120 of the sample chamber 100 under the control of the main control unit 14. On the other hand, the detection electrode 820 is connected to the signal detection unit 50, and the signal detection unit 50 amplifies an electric signal detected by the detection electrode 820 and outputs the amplified electric signal as a voltage signal. The voltage signal output from the signal detection unit 50 is transmitted to the main control unit 14 via the terminal 1012 and the connector 1013.

Before the sample is observed by using the scanning electron microscope in FIG. 3, the user places the sample holder 101 on the stage 64 and connects the terminal 1012 to the connector 1013 in a state (in this state, the gun valve 1001 is set in the CLOSE state) in which the sample room 600 is in an atmospheric environment. At this time, it is preferable to confirm by visual observation or other means that the insulating thin films 110, 111 and the conductive thin film 120 of the sample chamber 100 are not broken. After the sample holder 101 is placed on the stage 64 and the sample room 600 is sealed and can be evacuated to a vacuum, the user uses the GUI to input a vacuum evacuation start command of the sample room 600 to the main control unit 14. The main control unit 14 operates the bias power supply unit 20 before the vacuum evacuation is started, and supplies a bias potential to the conductive thin film 120 of the sample chamber 100. The main control unit 14 receives the voltage signal from the signal detection unit 50. Thereafter, the main control unit 14 preferably continues to receive the electric signal output from the signal detection unit 50 until the user completes the observation and opening of the sample room 600 to the atmosphere is started. Accordingly, a to-be-described-later breakage detection function of the sample chamber 100 according to the present embodiment can be continuously used during a period in which the sample holder 101 is in the sample room 600.

In addition, the main control unit 14 has a function of detecting whether an excessive leakage current flows from the bias power supply unit 20 to the detection electrode 820. When the sample 200 held in the sample chamber 100 leaks and comes into contact with the detection electrode 820, a large leakage current flows from the bias power supply unit 20 to the detection electrode 820, and the leakage current is a noise source and the sample 200 cannot be observed. When the sample 200 is held in the sample chamber 100 and the sandwiched sample is too much, the sample leaking out from between the insulating thin films comes into contact with the conductive thin film and the detection electrode, and thus the leakage current is generated. Alternatively, even if the sample holder 1 is not in contact with the housing when the sample holder 1 is placed in the housing, the sample may leak out from between the insulating thin films due to an impact generated at the time of the vacuum evacuation, and may come into contact with the conductive thin film and the detection electrode. Therefore, when the main control unit 14 detects a leakage current of a pre-set threshold value or more, the main control unit 14 outputs an alert, notifying that an excessive leakage current flows, to the display unit 16 via the computer 15. Accordingly, the user can take out the sample holder 101 from the sample room 600 before the vacuum evacuation of the sample room 600 is started.

When no leakage current abnormality is found, the main control unit 14 starts the vacuum evacuation of the sample room 600, determines the degree of vacuum inside the sample room 600 based on a read value of the pressure sensor 1017 provided in the sample room 600 or an elapsed time from the start of the vacuum evacuation, and when the main control unit 14 determines that electron beam irradiation-based image observation can be performed, the main control unit 14 displays the determination on the display unit 16 via the computer 15. Thereafter, the user uses the GUI to input an observation start command. The main control unit 14 that receives the observation start command sets the gun valve 1001 to the OPEN state, and controls each component of the housing 10 to start the observation.

The main control unit 14 converts, for each irradiation position of the electron beam 12 onto the sample chamber 100, the voltage signal output from the signal detection unit 50 of the sample holder 101 into pixel gradation data corresponding to the strength of the voltage signal, and outputs the pixel gradation data to the computer 15 as image data every time one frame scanning is completed, every time one line scanning is completed, or every time one pixel scanning is completed, depending on a deflection speed. The image data is subjected to image processing by the computer 15 as necessary, and is displayed on the display unit 16.

A principle of signal detection according to the present embodiment will be simply described. The sample 200 is irradiated with the electron beam 12 from a conductive thin film 120 side in a state in which the conductive thin film 120 is maintained at the same potential as that of the detection electrode 820 or a predetermined bias potential. Due to the electron beam in the irradiation, a local potential change occurs in a surface of the first insulating thin film 110 that is in contact with the sample 200. An electric signal generated based on the potential change is detected by the detection electrode 820 provided below the second insulating thin film 111 that sandwiches the sample 200 and is disposed on an opposite side. The local potential change described above depends on a dielectric constant of the sample 200 directly below the first insulating thin film 110. Therefore, the detection electrode 820 detects an electric signal having strength depending on a dielectric constant distribution of the sample 200 directly below the insulating thin film 110. Accordingly, a contrast of the sample to be observed is reflected in the image data based on the detection signal of the detection electrode 820.

Therefore, an acceleration voltage of the electron beam 12 is preferably set to a low acceleration voltage at which the electron beam 12 hardly passes through the first insulating thin film 110. This is because when the electron beam 12 penetrates the conductive thin film 120 and electrons are efficiently supplied to the first insulating thin film 110, a risk that the electron beam 12 penetrating the first insulating thin film 110 damages the sample is reduced.

Here, similarly to the sample chamber 5 according to the first embodiment, the sample chamber 100 according to the second embodiment also has a risk that the insulating thin films are broken when the sample room 600 is evacuated to a vacuum. Therefore, the scanning electron microscope shown in FIG. 3 preferably includes the first-stage vacuum evacuation system 1000 that reduces the risk of breakage of the sample chamber 100. A configuration and an operation of the first-stage vacuum evacuation system 1000 are the same as those in the first embodiment, and therefore, redundant description thereof will be omitted.

Further, in the configuration of the present embodiment, since the sample holder 101 functions as a signal detector as described above, the main control unit 14 can detect the breakage of the insulating thin films based on the output signal of the signal detection unit 50.

When the insulating thin films of the sample chamber 100 are broken, the conductive thin film 120 is also broken at the same time, so that a capacitance C of a capacitor including the conductive thin film 120 and the detection electrode 820 rapidly changes, and a large pulsed voltage signal is output from the signal detection unit 50. Since the pulsed voltage signal can be easily distinguished from a signal waveform detected by the signal detection unit 50 in a normal observation process, the main control unit 14 can detect that, by detecting the pulsed voltage signal, the insulating thin films are broken. When the main control unit 14 detects the breakage of the insulating thin films of the sample chamber 100, the main control unit 14 outputs a sample chamber breakage alert to the display unit 16 via the computer 15, and presents to the user a selection as to whether to open the sample room 600 to the atmosphere and take out the sample holder 101.

Accordingly, for example, when the insulating thin films are broken during the vacuum evacuation of the sample room 600, the breakage can be detected, and thus the sample exchange can be quickly performed and the observation throughput can be improved.

Further, when the breakage of the insulating thin films is detected by the breakage detection function of the sample chamber 100 described above during the electron beam irradiation, the main control unit 14 preferably performs the following operation to protect the electron gun 11. The main control unit 14 that detects the breakage of the insulating thin films of the sample chamber 100 during the electron beam irradiation immediately sets the gun valve 1001 to the CLOSE state, and prevents a decrease in the degree of vacuum in the vicinity of the electron gun 11 due to the sample or gas leaking from the sample chamber 100. Accordingly, the electron gun 11 is protected from the damage.

In addition, the electrostatic blanker 63 may be used to prevent sample-derived ions generated at the time of the breakage from being blown up, flowing back in the column 610 at a high speed, and colliding with the electron gun 11. In this case, the main control unit 14 that detects the breakage of the insulating thin films immediately operates the electrostatic blanker 63 to generate an electric field perpendicular to the traveling direction of the electron beam 12. Accordingly, the sample-derived ions are deflected out of an optical axis. Accordingly, the electron gun 11 is protected from the damage.

As described above, by monitoring the output signal of the signal detection unit 50 from before the vacuum evacuation up to when the sample room is opened to the atmosphere, an abnormality of the insulating thin films of the sample chamber can be immediately detected, the observation throughput can be improved, and further the electron gun 11 can be protected from contamination caused by the breakage of the sample chamber.

FIG. 4A shows another configuration diagram of the scanning electron microscope according to the second embodiment. The bias power supply unit 20, the main control unit 14, the computer 15, and the display unit 16 are the same as those of the scanning electron microscope in FIG. 3, and thus description thereof is omitted. The scanning electron microscope shown in FIG. 4A includes the sample exchange room 1100 separated from the sample room 600 by the gate valve 1107. In this case, the sample exchange room 1100 is also preferably provided with the first-stage vacuum evacuation system 1000a that reduces the risk of breakage of the insulating thin films of the sample chamber 100. The first-stage vacuum evacuation system 1000 shown in FIG. 3 may be provided instead of the first-stage vacuum evacuation system 1000a. In addition, the sample exchange room 1100 is provided with an optical microscope 1105 for detecting the breakage of the insulating thin films of the sample chamber 100. Hereinafter, redundant description of the configuration and the operation of the sample exchange room 1100 described with reference to FIGS. 2A to 2C according to the first embodiment will be omitted (the sample chamber 5 will be replaced with and read as the sample chamber 100, and the sample holder 1 will be replaced with and read as the sample holder 101 or the like).

The sample exchange room front portion 1101 shown in FIG. 4A is provided with the optical microscope 1105 for detecting the breakage of the insulating thin films of the sample chamber 100 during the vacuum evacuation of the sample exchange room 1100. The optical microscope 1105 may be one of a type in which a user can visually confirm an image, one of a type which is provided with a CCD camera or the like and can transmit a digital image to the main control unit 14, or one that can be switched between both the above types by a user.

In the state of FIG. 4B, the sample exchange room 1100 is evacuated to a vacuum. During this time, the breakage of the sample chamber 100 is detected by the image of the optical microscope 1105. The detection may be performed visually by the user, or when the image data of the optical microscope 1105 is transmitted to the main control unit 14, the main control unit 14 that receives the image data may detect the breakage by image processing.

When the user visually detects the breakage of the insulating thin films of the sample chamber 100, the user stops the vacuum evacuation of the sample exchange room 1100, opens the sample exchange room 1100 to the atmosphere using the GUI, takes out the sample holder 101, and exchanges the sample chamber 100. When the main control unit 14 detects the breakage of the sample chamber 100 by the image processing, the main control unit 14 outputs a sample chamber breakage alert to the display unit 16 via the computer 15, and presents to the user a selection as to whether to open the sample exchange room 1100 to the atmosphere and take out the sample holder 101.

When the main control unit 14 determines that the sample exchange room 1100 has reached a predetermined degree of vacuum without detecting the breakage of the insulating thin films of the sample chamber 100, the main control unit 14 releases the lock of the gate valve 1107 and notifies the user of the lock release by using the GUI. The user uses the GUI to issue an instruction for setting the gate valve 1107 to an OPEN state, and as shown in FIG. 4C, the user pushes the sample exchange rod 1103 to insert the sample holder 101 into the sample room 600 to place the sample holder 101 on the stage 64. At this time, the terminal 1012 of the sample holder 101 is connected to the connector 1013 in the sample room 600. Accordingly, the bias potential from the bias power supply unit 20 can be supplied to the conductive thin film 120, and the voltage signal from the signal detection unit 50 can be transmitted to the main control unit 14.

According to the configuration, since the vacuum evacuation for relaxing the rapid pressure change is performed in the sample exchange room having a smaller volume while the breakage detection of the insulating thin films is performed, the risk of breakage of the thin films can be reduced, the sample holder can be more quickly exchanged, and the observation throughput can be improved.

FIG. 5A shows still another configuration diagram of the scanning electron microscope according to the second embodiment. In FIG. 5A, since structures (the housing 10 and the like) on a sample room side of the gate valve 1107 are common, description thereof is omitted. The scanning electron microscope shown in FIG. 5A includes the sample exchange room 1100, and when the sample exchange room 1100 is evacuated to a vacuum by the first-stage vacuum evacuation system 1000a, an abnormality of a leakage current flowing to the detection electrode 820 and a breakage of the insulating films of the sample chamber 100 can be detected based on an output of the detection electrode 820 of the sample holder 101. The first-stage vacuum evacuation system 1000 shown in FIG. 3 may be provided instead of the first-stage vacuum evacuation system 1000a. Hereinafter, redundant description of the configuration and the operation of the sample exchange room 1100 described with reference to FIGS. 2A to 2C according to the first embodiment or FIGS. 4A to 4C according to the second embodiment will be omitted (the sample chamber 5 will be replaced with and read as the sample chamber 100, and the sample holder 1 will be replaced with and read as the sample holder 101 or the like).

In order to enable detection of the output of the detection electrode 820 in the sample exchange room 1100, as shown in FIG. 5A, the sample exchange room rear portion 1102 is provided with a connector fixture 1225 and a connector storage room 1221, and the connector storage room 1221 stores a connector 1223 held by a connector insertion rod 1222. The connector 1223 is connected to a bias power supply unit 1224 and the main control unit 14. Further, in the example, the sample exchange room rear portion 1102 is provided with the optical microscope 1105. The optical microscope 1105 is provided to detect the breakage of the insulating thin films of the sample chamber 100, similarly to the optical microscope 1105 provided in the sample exchange room front portion 1101 in the configuration of FIG. 4A. The bias power supply unit 1224 may be provided in common with or independently of the bias power supply unit 20 (see FIG. 3) connected to the connector 1013 in the sample room 600.

In order to evacuate the sample exchange room 1100 to a vacuum, first, the sample exchange room front portion 1101 shown in FIG. 5A is fixed to the sample exchange room rear portion 1102. Subsequently, as shown in FIG. 5B, the connector insertion rod 1222 is pushed and inserted into the sample exchange room rear portion 1102 until the connector 1223 contacts with the connector fixture 1225 with the air pressure in the sample exchange room 1100 maintained at the atmospheric pressure. Subsequently, as shown in FIG. 5C, the sample exchange rod 1103 is pushed to insert the sample holder 101 into the sample exchange room rear portion 1102. At this time, the terminal 1012 of the sample holder 101 is connected to the connector 1223 of the sample exchange room rear portion 1102. By connecting the terminal 1012 and the connector 1223, a bias potential output from the bias power supply unit 1224 can be supplied to the conductive thin film 120 of the sample chamber 100. The bias power supply unit 1224 supplies a bias potential the same as or different from a potential of the detection electrode 820 to the conductive thin film 120 of the sample chamber 100 under the control of the main control unit 14. On the other hand, the detection electrode 820 is connected to the signal detection unit 50, and the signal detection unit 50 amplifies an electric signal detected by the detection electrode 820 and outputs the amplified electric signal as a voltage signal. The voltage signal output from the signal detection unit 50 is transmitted to the main control unit 14 via the terminal 1012 and the connector 1223.

In this state, the user uses the GUI to input a vacuum evacuation start command to the main control unit 14. The main control unit 14 operates the bias power supply unit 1224 before the vacuum evacuation is started, and supplies a bias potential to the conductive thin film 120 of the sample chamber 100. The main control unit 14 receives the voltage signal from the signal detection unit 50.

The main control unit 14 determines whether an excessive leakage current flows from the bias power supply unit 1224 to the detection electrode 820. When the main control unit 14 detects a leakage current of a pre-set threshold value or more, the main control unit 14 outputs an alert, notifying that an excessive leakage current flows, to the display unit 16 via the computer 15. Accordingly, the user can take out the sample holder 101 from the sample exchange room 1100 before the vacuum evacuation of the sample exchange room 1100 is started. When no leakage current abnormality is found, the main control unit 14 starts the vacuum evacuation of the sample exchange room 1100.

As described above, the insulating thin films of the sample chamber 100 may be broken during the vacuum evacuation of the sample exchange room 1100. In the configuration, since a signal from the signal detection unit 50 can be detected in a state in which a bias voltage is applied to the conductive thin film 120 in the sample exchange room 1100, when a large pulsed voltage signal is output from the signal detection unit 50, the main control unit 14 can detect the breakage of the insulating thin films of the sample chamber 100 by detecting the output of the large pulsed voltage signal. When the main control unit 14 detects the breakage of the insulating thin films of the sample chamber 100, the main control unit 14 outputs a sample chamber breakage alert to the display unit 16 via the computer 15, and presents to the user a selection as to whether to open the sample exchange room 1100 to the atmosphere and take out the sample holder 101.

Further, when the optical microscope 1105 is provided in the sample exchange room rear portion 1102, the breakage of the sample chamber 100 can be detected in the same manner as in the case of the configuration of FIGS. 4A to 4C. When the main control unit 14 detects the breakage of the sample chamber 100 by the image processing, the main control unit 14 similarly outputs a sample chamber breakage alert to the display unit 16 via the computer 15, and presents to the user a selection as to whether to open the sample exchange room 1100 to the atmosphere and take out the sample holder 101.

When the main control unit 14 determines that the sample exchange room 1100 has reached a predetermined degree of vacuum without detecting the abnormality of the leakage current and the breakage of the insulating thin films of the sample chamber 100, the main control unit 14 releases the lock of the gate valve 1107 and notifies the user of the lock release by using the GUI. The user confirms the lock release of the gate valve 1107, and then pulls the sample exchange rod 1103 to move the sample holder 101 to the sample exchange room front portion 1101 (see FIG. 5B), and pulls the connector insertion rod 1222 to store the connector 1223 in the connector storage room 1221. Subsequently, the user uses the GUI to issue an instruction for setting the gate valve 1107 to an OPEN state, and pushes the sample exchange rod 1103 to insert the sample holder 101 into the sample room 600 to place the sample holder 101 on the stage 64. At this time, similar to FIG. 4C, the terminal 1012 of the sample holder 101 is connected to the connector 1013 in the sample room 600. Accordingly, the bias potential from the bias power supply unit 20 can be supplied to the conductive thin film 120, and the voltage signal from the signal detection unit 50 can be transmitted to the main control unit 14.

According to the configuration, since the leakage current abnormality detection and the breakage detection of the insulating thin films of the sample chamber can also be performed when the vacuum evacuation is performed in the sample exchange room, the sample holder can be quickly exchanged and the observation throughput can be improved when a defect occurs in the sample holder before or during the vacuum evacuation.

FIG. 6A shows still another configuration diagram of the scanning electron microscope according to the second embodiment. In FIG. 6A, since structures (the housing 10 and the like) on a sample room side of the gate valve 1107 are also common, description thereof is omitted. The scanning electron microscope shown in FIG. 6A includes the sample exchange room 1100, and when the sample exchange room 1100 is evacuated to a vacuum by the first-stage vacuum evacuation system 1000a, an abnormality of a leakage current flowing in the detection electrode 820 and a breakage of the insulating films of the sample chamber 100 can be detected based on an output of the detection electrode 820 of the sample holder 101, and a signal strength at the time of the observation can be confirmed in advance. The first-stage vacuum evacuation system 1000 shown in FIG. 3 may be provided instead of the first-stage vacuum evacuation system 1000a. Hereinafter, redundant description of the configuration and the operation of the sample exchange room 1100 described with reference to FIGS. 2A to 2C according to the first embodiment and FIGS. 4A to 4C or FIGS. 5A to 5C according to the second embodiment will be omitted (the sample chamber 5 will be replaced with and read as the sample chamber 100, and the sample holder 1 will be replaced with and read as the sample holder 101 or the like).

The sample exchange room rear portion 1102 shown in FIG. 6A is provided with an electron source 1301. The electron source 1301 is, for example, a tungsten thermoelectric source including a tungsten filament, a Wehnelt electrode, and an anode electrode.

FIG. 6B shows a state in which the terminal 1012 of the sample holder 101 is connected to the connector 1223 of the sample exchange room rear portion 1102. By connecting the terminal 1012 with the connector 1223, a bias potential from the bias power supply unit 1224 can be supplied to the conductive thin film 120, and a signal from the signal detection unit 50 can be transmitted to the main control unit 14. In this state, the signal strength at the time of the observation can be confirmed in advance using the electron source 1301.

When the signal strength at the time of the observation can be confirmed in advance using the electron source 1301, the user uses the GUI to issue a command to perform the previous confirmation, and inputs an acceleration voltage set at the time of the observation. The main control unit 14 operates the electron source 1301 and irradiates the sample chamber 100 with an electron beam accelerated at the set acceleration voltage. In this state, since the signal detected by the signal detection unit 50 is a signal obtained by the same principle as the signal obtained at the time of the observation, the obtained signal strength can be predicted in advance.

In order to quantitatively evaluate the obtained signal strength using the electron source 1301, a current amount of the electron beam from the electron source 1301 may be measured before or after the observation of the sample by using a faraday cup holder having an entrance port having the same shape as those of the window frame portion 313 and the window region 310. FIG. 6C shows a state in which a faraday cup holder 1302 is inserted instead of the sample holder 101 and an electron beam current amount of the electron source 1301 is measured. The faraday cup holder 1302 corresponds to a holder obtained by replacing the sample chamber 100 fixed in the vacuum partition wall with a faraday cup in the sample holder 101, and includes a faraday cup upper member 1303, a faraday cup lower member 1304, and a detection electrode 1305 that constitute the faraday cup, the signal detection unit 50 connected to the detection electrode 1305, and a terminal 1012 for electric signal communication with the outside.

The faraday cup upper member 1303 is made of metal, and an opening thereof has the same shape as that of the window frame portion 313 on an electron beam irradiation side of the sample chamber 100. The faraday cup lower member 1304 is an insulator, and connects and holds the faraday cup upper member 1303 and the detection electrode 1305 in an insulated state. By connecting the terminal 1012 of the faraday cup holder 1302 with the connector 1223, a bias potential from the bias power supply unit 1224 can be supplied to the faraday cup upper member 1303, and a signal from the signal detection unit 50 can be transmitted to the main control unit 14. The bias power supply unit 1224 supplies a potential the same as or different from a potential of the detection electrode 1305 to the faraday cup upper member 1303.

In this state, the electron source 1301 is operated, and a signal strength detected by the signal detection unit 50 is recorded. The signal strength obtained by the signal detection unit 50 of the sample chamber 100 can be quantitatively evaluated by normalizing the signal strength with a signal strength obtained by the faraday cup holder 1302.

According to such a configuration, a signal output strength at the time of observing the sample can be confirmed in advance.

In addition, although an example in which the optical microscope 1105 is provided in the sample exchange room front portion 1101 in the configurations of FIGS. 4A and 6A has been described, the optical microscope 1105 may be set as an optical lens 1400. This example is shown in FIG. 7. Accordingly, in the sample exchange room, the sample chamber can be visually observed at a relatively low cost.

FIG. 8 shows another example of using the optical lens 1400. In FIG. 8, the optical lens 1400 is provided on an insertion surface 1401 of the sample exchange rod 1103, and the sample exchange room front portion 1101 is provided with an optical mirror 1402 at a position directly above the sample holder 101 when the sample exchange rod 1103 is pulled out. When the user pushes the sample exchange rod 1103, the user often pushes the sample exchange rod 1103 while looking at the sample exchange rod insertion surface 1401 due to the way of applying a force, and thus convenience of visually detecting the breakage is improved.

REFERENCES SIGNS LIST

1: sample holder
2, 3: detector
5: sample chamber
6: vacuum partition wall lower part
7: vacuum partition wall upper part
8: sealing member
10: housing
11: electron gun
12: electron beam
13: deflector
14: main control unit
15: computer
16: display unit
20: bias power supply unit
50: signal detection unit
60: condenser lens
61: astigmatism corrector
62: objective lens
63: electrostatic blanker
64: stage
100: sample chamber
101: sample holder
110: first insulating thin film
111: second insulating thin film
120: conductive thin film
130, 911: outer frame portion
200: sample
310, 913: window region
313, 912: window frame portion
920: vacuum partition wall lower part
921: vacuum partition wall upper part
923: sealing member
820: detection electrode
600: sample room
610: column
1000, 1000a: first-stage vacuum evacuation system
1001: gun valve
1009: vacuum pump
1010: slow evacuation path
1011: high-speed evacuation path
1012: terminal
1013: connector
1014: slow evacuation path valve
1015: high-speed evacuation path valve
1016: evacuation flow rate adjustment valve
1017: pressure sensor
1100: sample exchange room
1101: sample exchange room front portion
1102: sample exchange room rear portion
1103: sample exchange rod
1104: sample holder attachment
1105: optical microscope
1106: sample exchange room sealing member
1107: gate valve
1108: sample exchange room pressure sensor
1221: connector storage room
1222: connector insertion rod
1223: connector
1224: bias power supply unit
1225: connector fixture
1301: electron source
1302: faraday cup holder
1303: faraday cup upper member
1304: faraday cup lower member
1305: detection electrode
1400: optical lens
1401: sample exchange rod insertion surface
1402: optical mirror

The invention claimed is:

1. A charged particle beam device comprising:
an electron optical system;
a sample room;
a sample holder including a terminal for electric signal communication and configured to hold a sample irradiated with an electron beam from the electron optical system;
a first connector connected to the terminal of the sample holder in a state in which the sample holder is placed in the sample room;

a vacuum evacuation system including a first-stage vacuum evacuation system configured to evacuate a surrounding atmosphere of the sample holder to a vacuum; and a main control unit, wherein the sample holder includes:
- a sample chamber including a first insulating thin film and a second insulating thin film that sandwich and hold the sample in a liquid or gel form and face each other, and a conductive thin film laminated on the first insulating thin film,
- a vacuum partition wall inside which the sample chamber holding the sample is fixed in a state in which the conductive thin film is exposed to the surrounding atmosphere, and whose internal space is kept at a degree of vacuum at least lower than that of the sample room at the time of observation of the sample,
- a detection electrode disposed to face the second insulating thin film in a state in which the sample chamber is fixed to the vacuum partition wall, and
- a signal detection unit connected to the detection electrode, the first-stage vacuum evacuation system is provided in the sample room, and the main control unit is configured to, before the surrounding atmosphere of the sample holder is evacuated from an atmospheric pressure to a vacuum in a state in which the sample holder is placed in the sample room, supply a bias potential to the conductive thin film of the sample chamber via the first connector, receive a detection signal from the signal detection unit, and detect an abnormality of the sample chamber based on the detection signal.

2. The charged particle beam device according to claim 1, wherein
the main control unit is configured to detect, based on the detection signal, an abnormality of the sample chamber by detecting a leakage current caused by contact of the sample with the detection electrode or a pulsed voltage caused by breakage of the sample chamber.

3. The charged particle beam device according to claim 1, wherein
the electron optical system includes an electron gun configured to emit the electron beam and a gun valve configured to maintain a degree of vacuum in a vicinity of the electron gun, and
the main control unit is configured to close the gun valve when an abnormality of the sample chamber is detected based on the detection signal.

4. The charged particle beam device according to claim 1, wherein
the electron optical system includes an electrostatic blanker configured to generate an electrostatic field perpendicular to a traveling direction of the electron beam, and
the main control unit is configured to operate the electrostatic blanker to generate the electrostatic field when an abnormality of the sample chamber is detected based on the detection signal.

5. A charged particle beam device comprising:
an electron optical system;
a sample room;
a sample holder including a terminal for electric signal communication and configured to hold a sample irradiated with an electron beam from the electron optical system;

a first connector connected to the terminal of the sample holder in a state in which the sample holder is placed in the sample room;
a vacuum evacuation system including a first-stage vacuum evacuation system configured to evacuate a surrounding atmosphere of the sample holder to a vacuum;
a sample exchange room separated from the sample room by a gate valve and provided with the first-stage vacuum evacuation system;
a second connector connected to the terminal of the sample holder in a state in which the sample holder is placed in the sample exchange room; and
a main control unit, wherein
the sample holder includes:
- a sample chamber including a first insulating thin film and a second insulating thin film that sandwich and hold the sample in a liquid or gel form and face each other, and a conductive thin film laminated on the first insulating thin film,
- a vacuum partition wall inside which the sample chamber holding the sample is fixed in a state in which the conductive thin film is exposed to the surrounding atmosphere, and whose internal space is kept at a degree of vacuum at least lower than that of the sample room at the time of observation of the sample,
- a detection electrode disposed to face the second insulating thin film in a state in which the sample chamber is fixed to the vacuum partition wall, and
- a signal detection unit connected to the detection electrode, and the main control unit is configured to, before the surrounding atmosphere of the sample holder is evacuated from an atmospheric pressure to a vacuum in a state in which the sample holder is placed in the sample exchange room, supply a bias potential to the conductive thin film of the sample chamber via the second connector, receive a detection signal from the signal detection unit, and detect an abnormality of the sample chamber based on the detection signal.

6. The charged particle beam device according to claim 5, wherein
the main control unit is configured to detect, based on the detection signal, an abnormality of the sample chamber by detecting a leakage current caused by contact of the sample with the detection electrode or a pulsed voltage caused by breakage of the sample chamber.

7. The charged particle beam device according to claim 5, wherein
the sample exchange room is provided with an optical system, and
a state of the sample chamber is able to be observed by the optical system while the surrounding atmosphere of the sample holder is being evacuated from an atmospheric pressure to a vacuum in the state in which the sample holder is placed in the sample exchange room.

8. The charged particle beam device according to claim 5, wherein
the sample exchange room is provided with an electron source, and
the main control unit is configured to supply a bias potential to the conductive thin film of the sample chamber via the second connector and receive the detection signal from the signal detection unit when the conductive thin film of the sample chamber is irradiated with an electron beam from the electron source.

9. A charged particle beam device comprising:
an electron optical system;
a sample room;
a sample holder configured to hold a sample irradiated with an electron beam from the electron optical system;
a vacuum evacuation system including a first-stage vacuum evacuation system configured to evacuate a surrounding atmosphere of the sample holder to a vacuum;
a sample exchange room separated from the sample room by a gate valve and provided with the first-stage vacuum evacuation system; and
a main control unit configured to evacuate the surrounding atmosphere of the sample holder from an atmospheric pressure to a vacuum in a state in which the sample holder is placed in the sample exchange room, wherein
the sample holder includes:
- a sample chamber including a first insulating thin film and a second insulating thin film that sandwich and hold the sample in a liquid or gel form and face each other, and
- a vacuum partition wall inside which the sample chamber holding the sample is fixed in a state in which the first insulating thin film is exposed to the surrounding atmosphere, and whose internal space is kept at a degree of vacuum at least lower than that of the sample room at the time of observation of the sample, and the sample exchange room is provided with an optical system, and a state of the sample chamber is able to be observed by the optical system while the surrounding atmosphere of the sample holder is being evacuated from an atmospheric pressure to a vacuum in the state in which the sample holder is placed in the sample exchange room.

10. The charged particle beam device according to claim 9, wherein
the optical system is an optical microscope or an optical lens.

11. The charged particle beam device according to claim 9, wherein
the optical system is an optical lens, and
the optical lens is provided on an insertion surface of the sample exchange room into which a sample exchange rod that moves the sample holder between the sample exchange room and the sample room is inserted.

* * * * *